(12) United States Patent
Annunziata et al.

(10) Patent No.: US 10,700,263 B2
(45) Date of Patent: Jun. 30, 2020

(54) ANNEALED SEED LAYER FOR MAGNETIC RANDOM ACCESS MEMORY

(71) Applicant: International Business Machines Corporation, Armonk, NY (US)

(72) Inventors: Anthony J. Annunziata, Stamford, CT (US); Chandrasekharan Kothandaraman, New York, NY (US); Janusz J. Nowak, Highland Mills, NY (US); Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/886,232

(22) Filed: Feb. 1, 2018

(65) Prior Publication Data

US 2019/0237659 A1    Aug. 1, 2019

(51) Int. Cl.
*H01L 43/02*    (2006.01)
*H01L 43/08*    (2006.01)
*H01L 27/22*    (2006.01)
*H01L 43/12*    (2006.01)

(52) U.S. Cl.
CPC ............ *H01L 43/02* (2013.01); *H01L 27/222* (2013.01); *H01L 43/08* (2013.01); *H01L 43/12* (2013.01)

(58) Field of Classification Search
CPC ......... H01L 43/02; H01L 43/12; H01L 43/08; H01L 27/222
See application file for complete search history.

(56) References Cited

U.S. PATENT DOCUMENTS

| | | |
|---|---|---|
| 6,417,561 B1 | 7/2002 | Tuttle |
| 6,703,654 B1 | 3/2004 | Horng et al. |
| 7,432,192 B2 | 10/2008 | Feng et al. |
| 7,585,768 B2 | 9/2009 | Bu et al. |
| 7,897,508 B2 | 3/2011 | Zheng et al. |
| 8,334,213 B2 | 12/2012 | Mao |
| 8,420,537 B2 | 4/2013 | Chanda et al. |
| 2003/0199104 A1 | 10/2003 | Leuschner et al. |
| 2010/0301480 A1* | 12/2010 | Choi ............... H01L 27/228 257/751 |
| 2016/0027733 A1 | 1/2016 | Bao et al. |

(Continued)

FOREIGN PATENT DOCUMENTS

| | | |
|---|---|---|
| CN | 103339672 | 10/2013 |
| JP | 2007281485 | 10/2007 |
| JP | 5064689 | 10/2012 |

*Primary Examiner* — Thanh Y. Tran
(74) *Attorney, Agent, or Firm* — Fleit Intellectual Property Law; Thomas S. Grzesik (57) ABSTRACT

A semiconductor device and a method for fabricating the same. The semiconductor device includes a substrate. At least one trench line is formed within the substrate. A pad layer is formed in contact with the at least one trench line. A seed layer is formed on and in contact with the pad layer. The seed layer has a Root Mean Square surface roughness equal to or less than 3 Angstroms. A magnetic tunnel junction stack is formed on and in contact with the seed layer. The method includes forming a seed layer on and in contact with a semiconductor structure. The seed layer is annealed and then planarized. A magnetic tunnel junction stack is formed on and in contact with the seed layer after the seed layer has been planarized.

5 Claims, 8 Drawing Sheets

(56) References Cited

U.S. PATENT DOCUMENTS

| | | |
|---|---|---|
| 2016/0240771 A1 | 8/2016 | Hu |
| 2016/0276169 A1 | 9/2016 | Zhong |
| 2016/0301000 A1* | 10/2016 | Kim ........................ H01L 43/08 |
| 2017/0084821 A1* | 3/2017 | Kim ........................ H01L 43/12 |
| 2017/0092848 A1* | 3/2017 | Jang ........................ H01L 43/08 |
| 2017/0092849 A1* | 3/2017 | Park ........................ H01L 29/82 |
| 2017/0092850 A1* | 3/2017 | Lee ........................ H01L 43/12 |
| 2018/0342669 A1* | 11/2018 | Kim ........................ H01L 43/12 |

* cited by examiner

ANNEALED SEED LAYER FOR MAGNETIC RANDOM ACCESS MEMORY

BACKGROUND OF THE INVENTION

The present disclosure generally relates to semiconductor devices, and more particularly relates to magnetic random access memory.

Spin-transfer torque magnetic random access memory (STT-MRAM) devices offer many benefits over semiconductor-based memories such as dynamic random-access memory (DRAM) and static random-access memory (SRAM). In order to compete with DRAM and SRAM, the STT-MRAM devices usually need to be integrated into the wiring layers of standard silicon logic and memory chips.

SUMMARY OF THE INVENTION

In one embodiment, a method for fabricating a semiconductor device is provided. The method comprises forming a seed layer on and in contact with a semiconductor structure. The seed layer is annealed and then planarized. A magnetic tunnel junction stack is formed on and in contact with the seed layer after the seed layer has been planarized.

In another embodiment, a semiconductor device is provided. The semiconductor device comprises a substrate. At least one trench line is formed within the substrate. A pad layer is formed in contact with the at least one trench line. A seed layer is formed on and in contact with the pad layer. The seed layer has a Root Mean Square surface roughness equal to or less than 3 Angstroms. A magnetic tunnel junction stack is formed on and in contact with the seed layer.

In yet another embodiment, an integrated circuit is provided. The integrated circuit comprises a semiconductor device. The semiconductor device comprises a substrate. At least one trench line is formed within the substrate. A pad layer is formed in contact with the at least one trench line. A seed layer is formed on and in contact with the pad layer. The seed layer has a Root Mean Square surface roughness equal to or less than 3 Angstroms. A magnetic tunnel junction stack is formed on and in contact with the seed layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Various embodiments will now be discussed in further detail with regard to semiconductor devices and methods of manufacturing same and, in particular, to a fabrication method and structure of a semiconductor device comprising a magnetic random-access memory, and an annealed chemical mechanical polish seed layer. Embodiments of the present disclosure provide for an optimum seed layer to be formed on a landing pad layer on which to deposit or "grow" MUM material stack. The seed layer has a strong effect on the device performance and uniformity. Furthermore, the smoothness and stress/strain state of the seed layer plays an important role in the device characteristics as well.

It is to be understood that the various layers and/or regions shown in the accompanying drawings are not drawn to scale, and that one or more layers and/or regions of a type commonly used in complementary metal-oxide semiconductor (CMOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present disclosure may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present disclosure may be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "vertical" refers to a direction perpendicular to a substrate in the views herein. As used herein, "horizontal" refers to a direction parallel to a substrate views herein. As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate. As used herein, "lateral," "lateral side," "lateral surface" refers to a side surface of an element (e.g., a layer, opening, etc.), such as a left or right side surface in the cross-sectional views herein.

Figure 1:
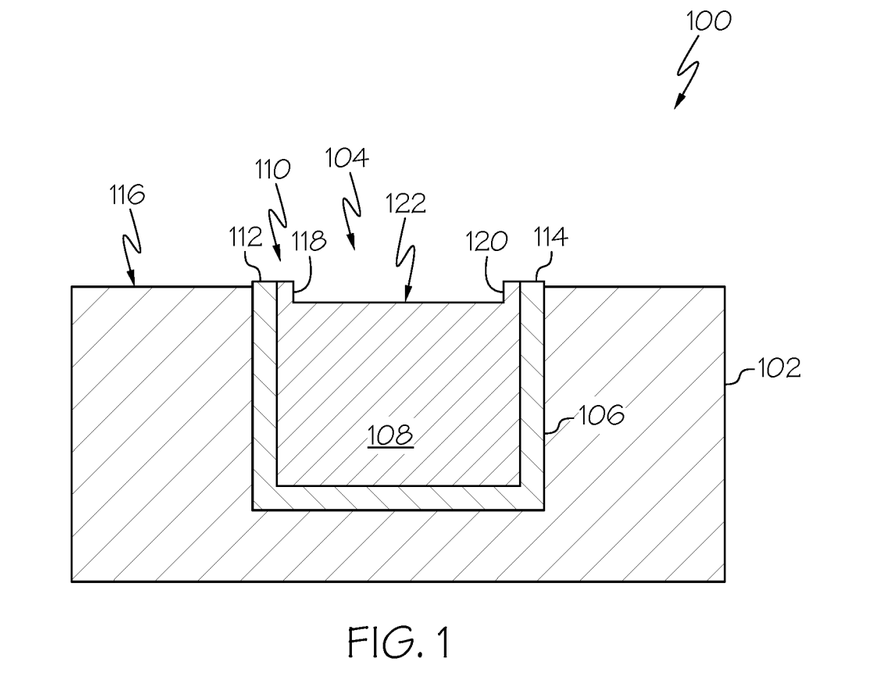
FIG. 1 is a cross-sectional view of an initial semiconductor structure comprising an Mx patterned area within a substrate according to one embodiment of the present disclosure.

Referring to FIG. 1, a semiconductor structure 100 comprising a substrate 102 is shown. The substrate 102 may comprise silicon, but other materials are applicable as well. FIG. 1 further shows that one or more Mx patterning processes have been performed to form a trench 104 within the substrate 102. In one embodiment, the Mx patterning processes include defining the line/trench 104 using lithography. Lithography may include direct application of PR or use of more complex stacks such as trilayer (e.g., from bottom to top: OPL, SiARC/SiOx, PR). The substrate 102 is then etched using, for example, a fluorocarbon based plasma process (e.g. using $C_xF_y$ chemistry) to form the trench/line 104. The lithography is then stripped away typically using an $O_2$ plasma and then the liner is deposited.

A liner 106 may then be subsequently formed on horizontal and vertical surfaces of the trench 104. The liner 106 facilitates growth of a trench metal layer 108 (e.g., a trench line or wire). In one embodiment, the trench metal layer 108 comprises copper, but other metals or alloys are applicable as well. In some embodiments, the liner 106 comprises TaN, Ta, Co, Ru, etc. In some embodiments, when the formation of the liner 106 creates a lip 110 where portions 112, 114 of the liner 106 extend above a top surface 116 of the substrate 102. These portions 112, 114 of the liner 106 have a height that is greater than a height of the top surface 116 of the substrate 102. Portions 118, 120 of the trench metal layer 108 may contact the inner sidewalls of the liner portions 112, 114 such that these portions 118, 120 of the trench metal layer 108 also extend beyond the top surface 116 of the substrate 102. The portions 118, 120 of the trench metal layer 108 may also formed over and in contact with a top surface of liner portions 112, 114 as well. FIG. 1 further shows that the trench metal layer 108 may be recessed in an area 122 between portions 118, 120. The recessed area 122 comprises a top surface that is below the top surface of portions 118, 120 and, in some embodiments, may be below the top surface 116 of the substrate 102. In other embodiments, the lip 110 and/or recessed area 122 are not formed.

Figure 2:
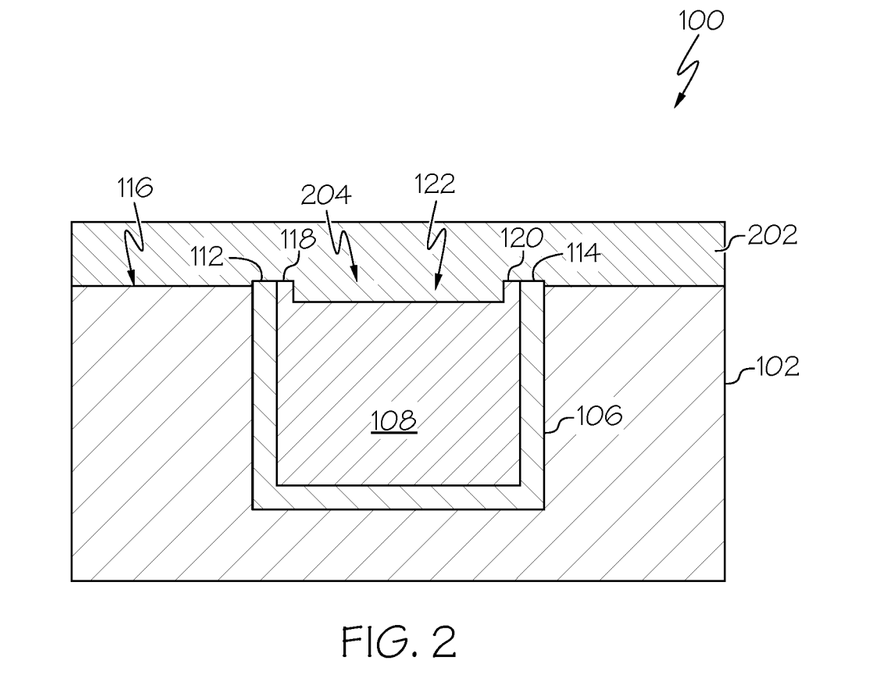
FIG. 2 is a cross-sectional view of the semiconductor structure after a landing pad layer has been formed according to one embodiment of the present disclosure.

After the structure in FIG. 1 is formed, a landing pad layer 202 comprising a conductive material such as tantalum nitride ("TaN") is then deposited over the substrate 102 and the trench metal layer 108, as shown in FIG. 2. The pad layer 202 is formed on and contacts the substrate 102 and trench metal layer 108. If recessed area 122 is formed, the pad layer 202 comprises a portion 204 that contacts the recessed area 122 of the trench metal layer 108. The pad layer 202 may be deposited using a physical vapor deposition ("PVD") method, a chemical vapor deposition method ("CVD"), or the like. In some embodiments, portion 204 of the pad layer 202 extends below the top surface 116 of the substrate 102. It should be noted that the various embodiments of the present invention are not limited to TaN for layer 202. For example, tantalum and other alloys compatible with the trench metal layer 108 may be used as well. Any bumps within the pad layer 202 resulting from the lip 110 and corresponding portions 118, 120 of the trench metal layer 108 are removed, for example, via a chemical mechanical etching and planarization processes.

Figure 3:
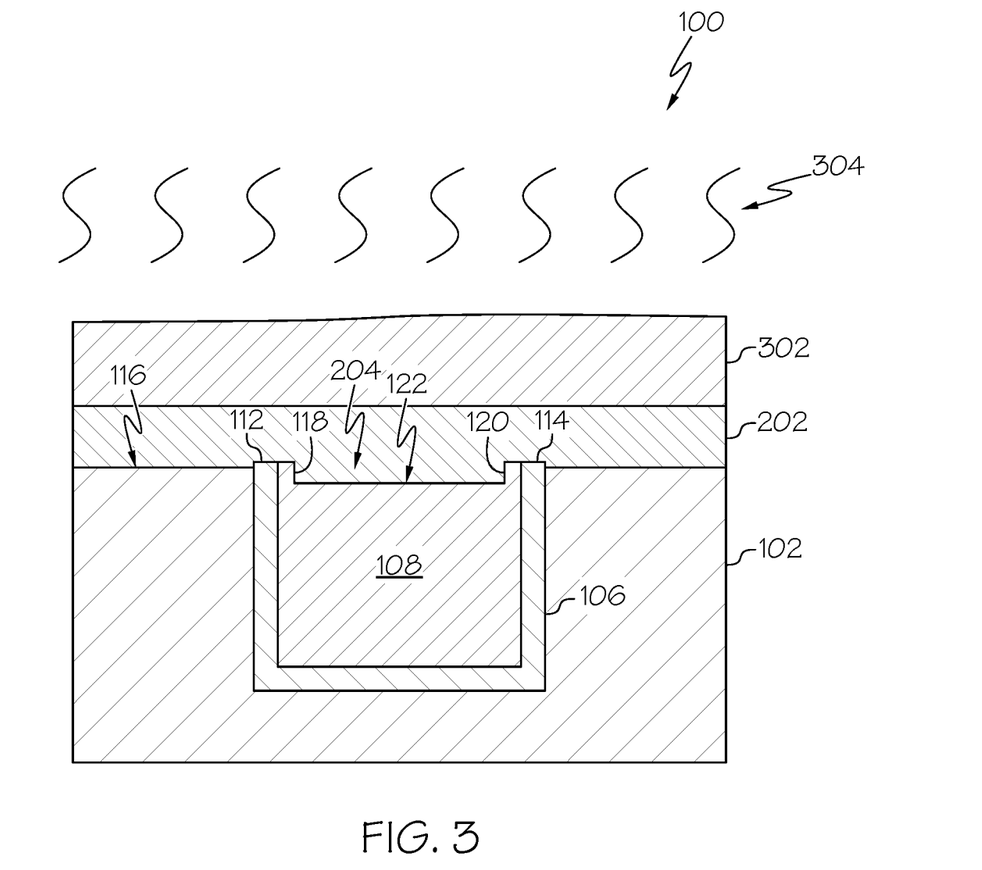
FIG. 3 is a cross-sectional view of the semiconductor structure after a seed layer has been formed in contact with the landing pad layer and subsequently annealed according to one embodiment of the present disclosure.

After the pad layer 202 has been formed (and optionally polished/planarized), a seed layer 302 is formed on and in contact with the pad layer 202. This seed layer enables the proper growth of the layers comprising the magnetic tunnel junction which will be grown on top of this layer. The seed layer 302 is formed using one or more silicon wafer deposition processes such as sputtering, chemical vapor deposition, and/or the like. In one embodiment, the seed layer 302 comprises NiCr, Jr, Ru, or other optimized materials. The thickness of the seed layer 302, in one embodiment, may be in the range of 1 angstrom to 20 nanometers, but other thicknesses are applicable as well.

Figure 4:
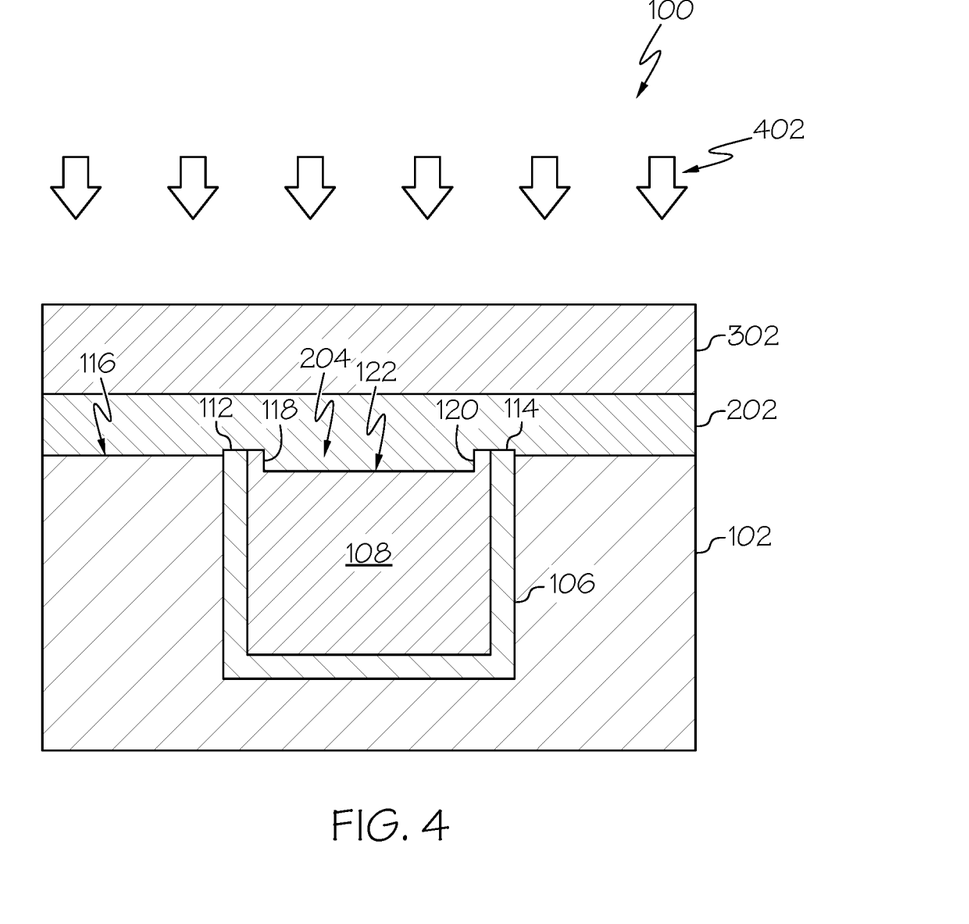
FIG. 4 is a cross-sectional view of the seed layer has been planarized according to one embodiment of the present disclosure.

FIG. 3 further shows that after the seed layer 302 has been formed an annealing process 304 is performed. The anneal alters the grain structure in the seed layer, thus forming an appropriate template for the growth of the subsequent layers for the function of the magnetic tunnel junction. In some embodiments, the anneal is performed in-situ. However, in other embodiments, vacuum is broken and the wafer is moved to a different tool where the anneal is performed. The temperature of the anneal, in one embodiment, ranges from 200° C. to 400° C. However, other operating temperatures are applicable as well. FIG. 4 shows that a chemical mechanical polish (CMP) 402 is then performed to smooth/planarize the surface of the seed layer 302. The wafer may be moved to another tool to perform the CMP. In some embodiments, the surface roughness (RMS value) of the seed layer 302 is 1 to 3 Angstroms after the CMP. The grain growth that accompanies the annealing of the seed layer may result in a rough surface that will result in the roughening of the subsequent layers. Such roughness results in the unwanted shorting of the magnetic tunnel junction. Hence smoothing the surface of the seed layer via CMP ensures functional memory elements are achieved.

Figure 5:
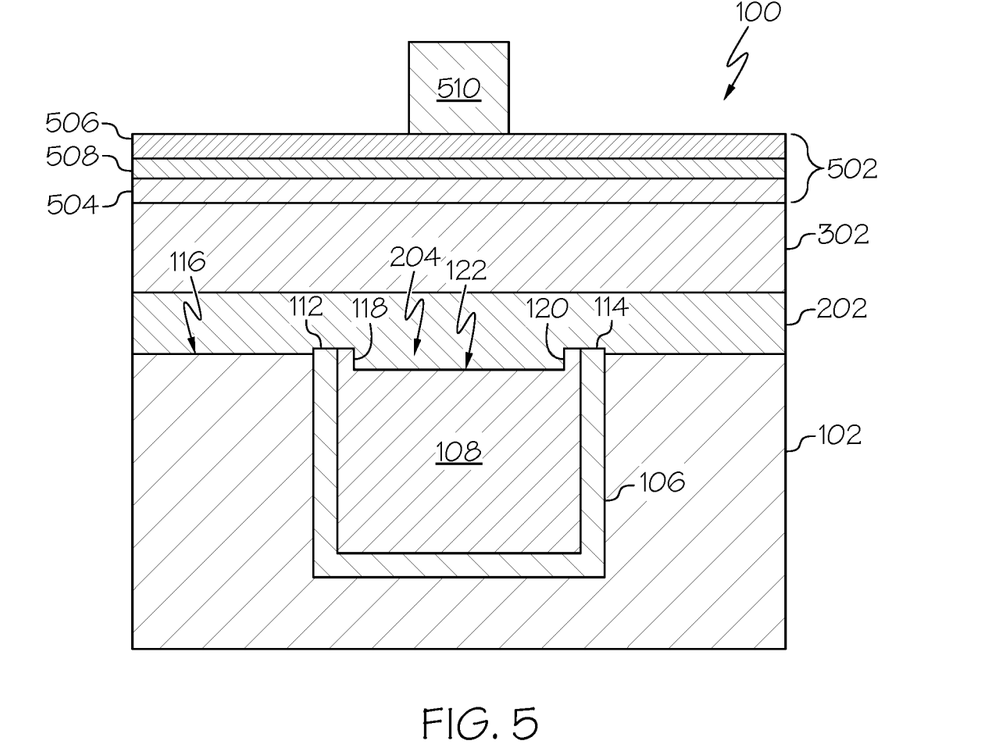
FIG. 5 is a cross-sectional view of the semiconductor structure after magnetic tunnel junction stack layers have been deposited and a hardmask has been formed according to one embodiment of the present disclosure.

After the seed layer 302 has been polished, a magnetic tunnel junction (MTJ) stack 502 is formed on and in contact with the seed layer 302, as shown in FIG. 5. The MTJ stack 502 comprises two magnetic layers 504, 506 that are separated by an insulating layer 508 referred to as a tunnel barrier. The first magnetic layer is formed on and in contact with the seed layer 302. The insulating layer 508 is then deposited over the first magnetic layer 504, and the second magnetic layer 506 is then deposited over the insulating layer 508.

One of the magnetic layers 504, 506 has a high level of magnetization and is fixed/pinned (reference layer). The other magnetic layer 504, 506 has a lower amount of magnetization and is referred to as the free layer (i.e., not pinned). The free layer is able to rotate its magnetization to be parallel with the pinned layer or anti-parallel to the pinned layer. Parallel magnetizations allow current to tunnel through the tunnel barrier resulting in low resistance. Anti-parallel magnetizations do not allow current to tunnel through the tunnel barrier resulting in high resistance. The magnetizations can be controlled either by passing current through a different copper line so that the current induces a magnetic field that interacts with the free layer or by directly injecting spin polarized current into the device which produces a torque on the magnetic free layer.

Figure 6:
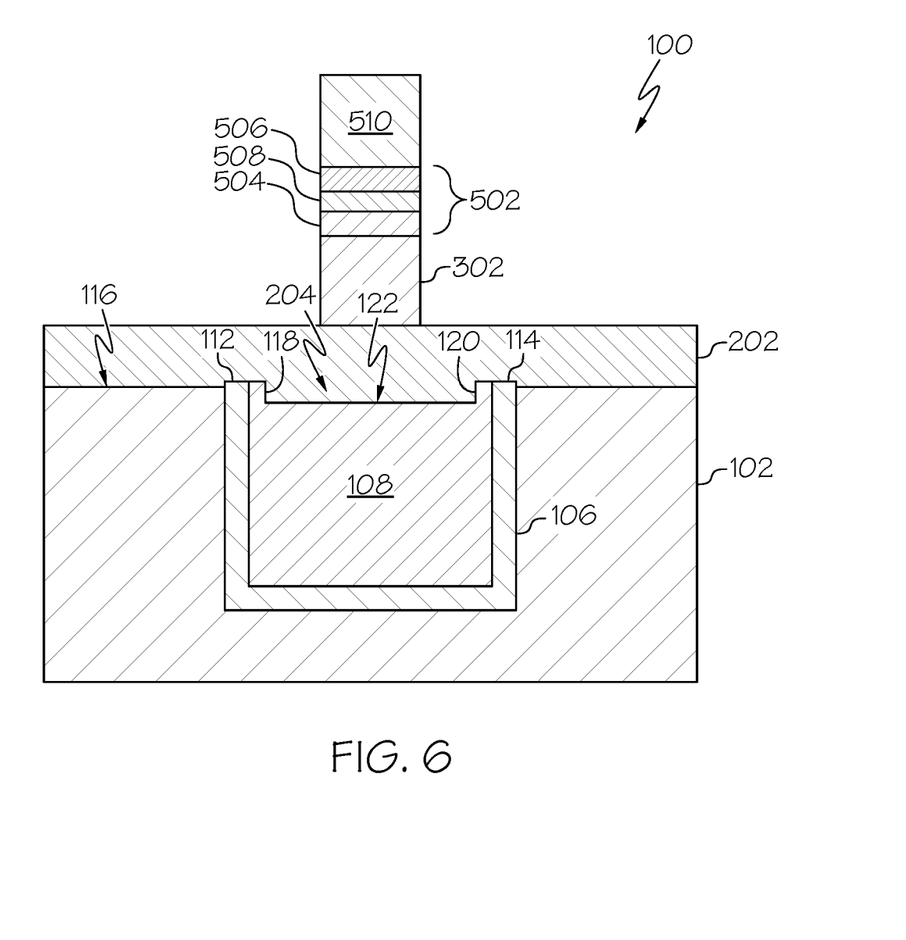
FIG. 6 is a cross-sectional view of the semiconductor structure after a magnetic tunnel junction stack formed according to one embodiment of the present disclosure.

FIG. 5 also shows a hardmask layer 510 having been formed/patterned on and in contact with the second magnetic layer 506. In one embodiment, the hardmask layer 510 comprises tantalum nitride, but other materials are applicable as well. After the hardmask layer 510 is formed, the MTJ stack 502 is etched back using one or more etching processes such as reactive ion etching ("RIE"). For example, FIG. 6 shows that portions of the MTJ stack 502 and the seed layer 302 not situated under the hardmask layer 508 have been removed. The etch process stops on the pad layer 202.

Figure 7:
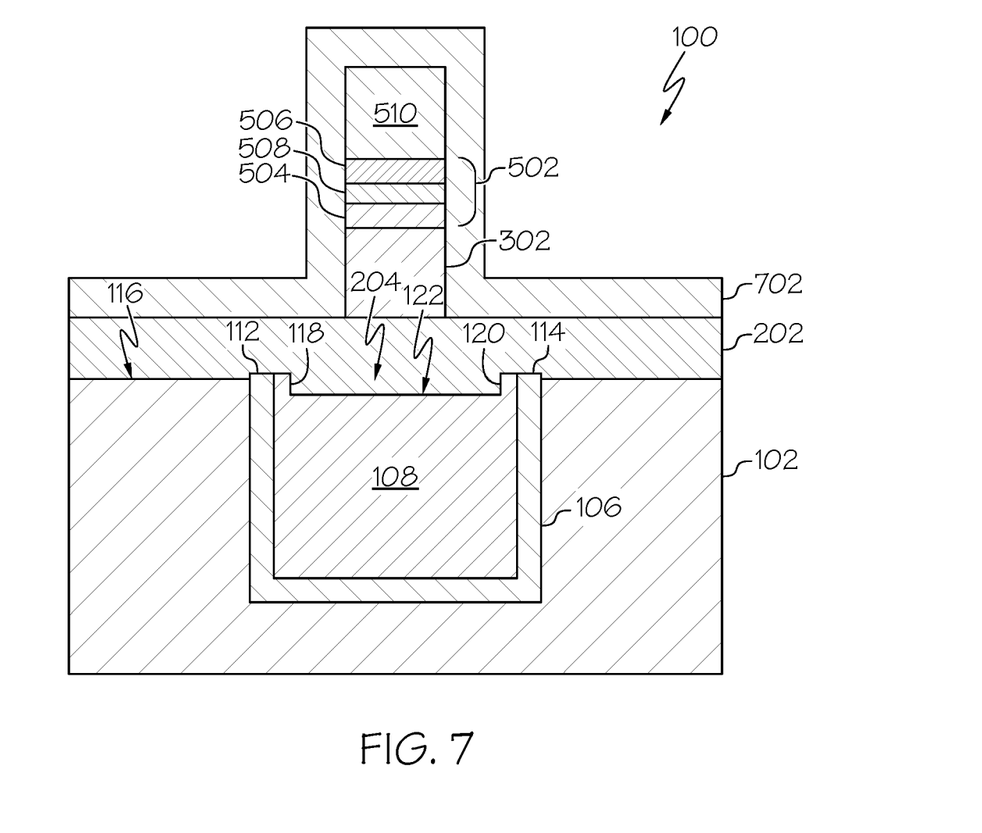
FIG. 7 is a cross-sectional view of the semiconductor structure of FIG. 5 after spacer material has been deposited over the structure according to one embodiment of the present disclosure.
Figure 8:
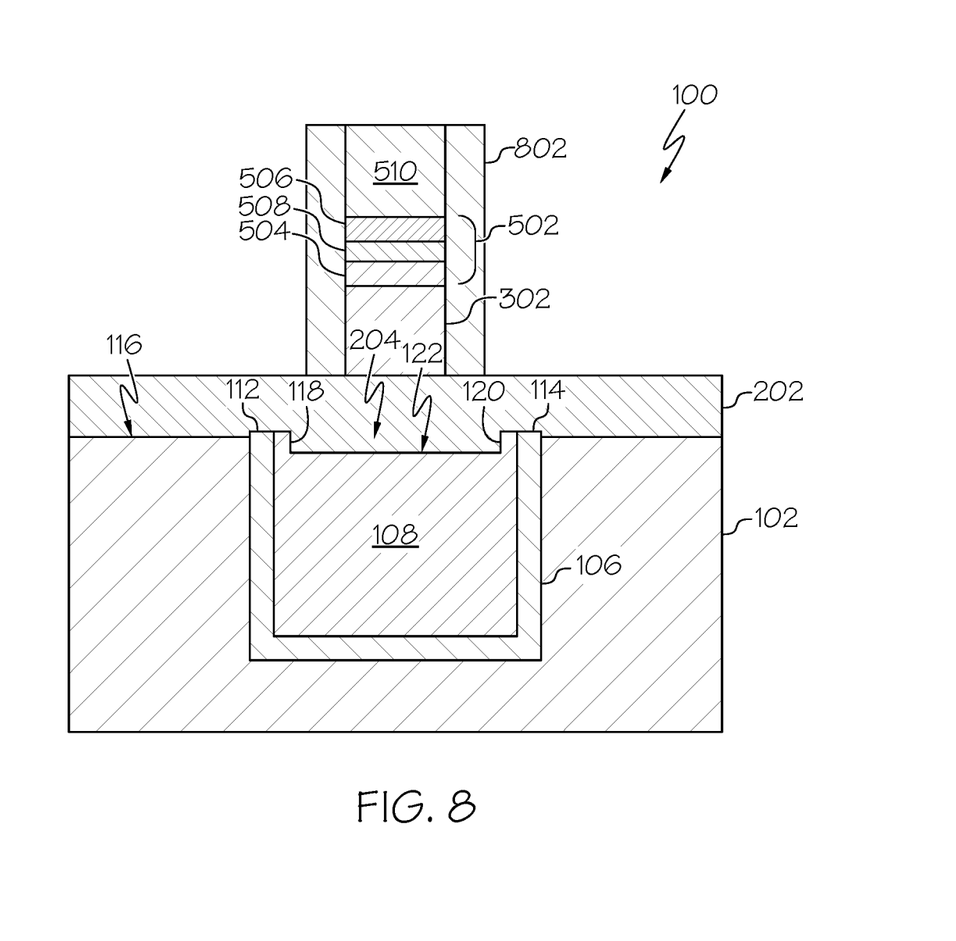
FIG. 8 is a cross-sectional view of the semiconductor structure after the spacer material has been etched to form a sidewall spacer for the magnetic tunnel junction stack according to one embodiment of the present disclosure.

FIG. 7 shows that after the MTJ stack 502 has been etched, a spacer material 702 such as silicon nitride is deposited on and in contact with the pad layer 202, the sidewalls of the MTJ stack 502, the sidewalls of the hardmask 510, and a top surface of the hardmask 510. One or more etching processes are performed to remove the spacer material 702 from horizontal surfaces of the structure. This process forms a spacer 802 on top of the seed layer 302 and the sidewalls of the MTJ stack 502 and hardmask 510, as shown in FIG. 8. Conventional fabrication processes are then performed to complete the device.

The above embodiments are advantageous since the grain growth during the annealing process enables grain-growth resulting in fewer grain boundaries within the seed layer. Any roughness that might result from this grain growth is polished away by the CMP process. This enables the release of any stored elastic energy that might affect the structure of the reference layer of the magnetic tunnel junctions. Moreover, the presence of grain boundaries causes significant variability in the properties of the magnetic tunnel junction.

Figure 9:
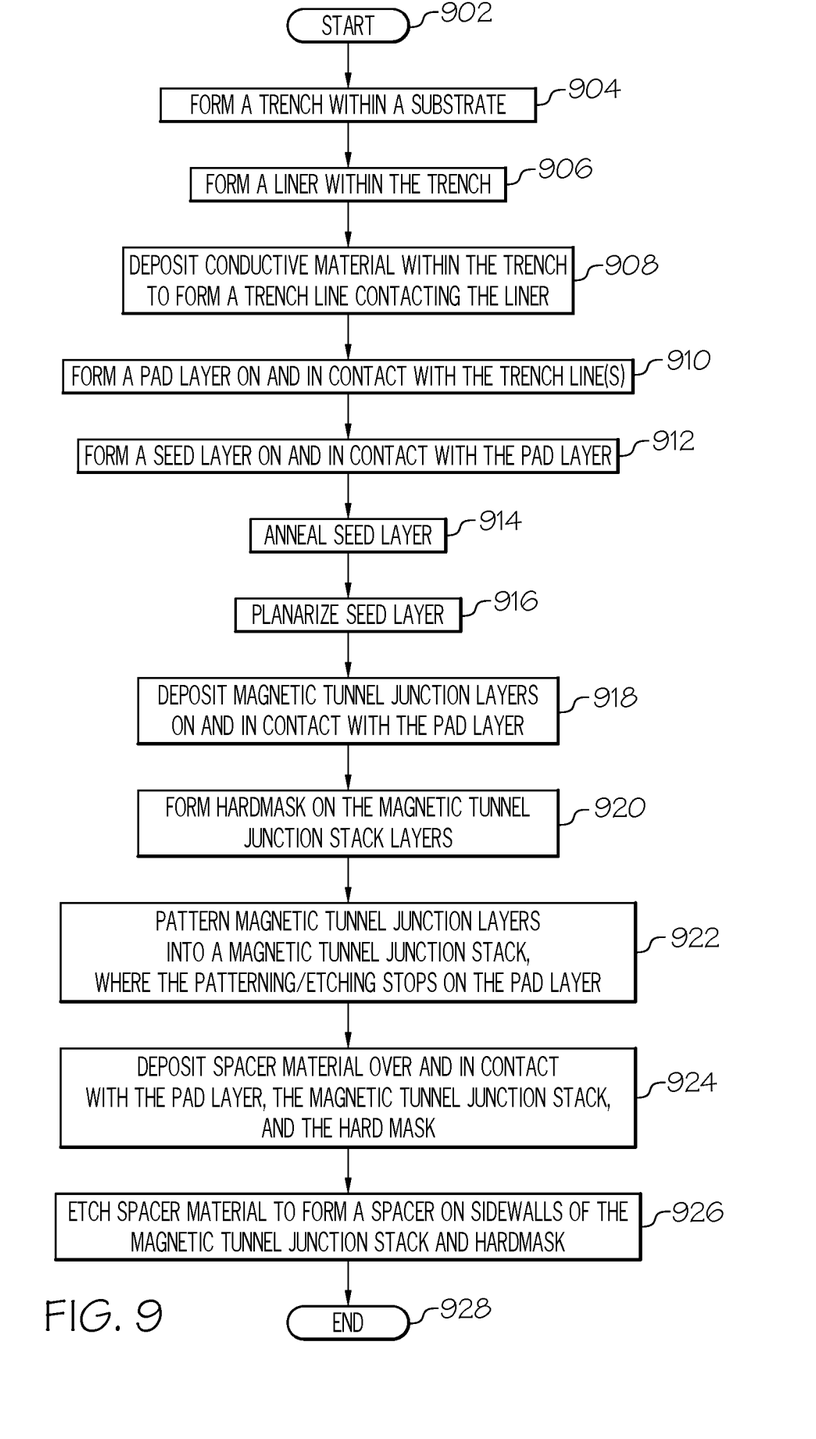
FIG. 9 is an operational flow diagram illustrating one process for forming a semiconductor structure comprising a self-aligned landing pad and a magnetic tunnel junction stack according to one embodiment of the present disclosure.

FIG. 9 is an operational flow diagram illustrating one process for forming a semiconductor structure comprising an annealed and CMP seed layer for a magnetic tunnel junction stack according to one embodiment of the present disclosure. In FIG. 9, the operational flow diagram begins at step 902 and flows directly to step 904. It should be noted that each of the steps shown in FIG. 9 has been discussed in greater detail above with respect to FIGS. 1-8.

A trench, at step 904, is formed within a substrate. A liner, at step 906, is then formed within the trench. A conductive material, at step 908, is deposited within the trench to form a trench line contacting the liner. A pad layer, at step 910, is formed on and in contact with the trench line(s) (and optionally planarized). A seed layer, at step 912, is formed on and in contact with the pad layer. The seed layer, at step 914, is annealed. The seed layer, at step 916, is then planarized using a process such as CMP. Magnetic tunnel junction stack layers, at step 918, are deposited on and in contact with the seed layer. A hardmask, at step 920, is formed on the magnetic tunnel junction stack layers. The magnetic tunnel junction stack layers, at step 922, are then patterned into a magnetic tunnel junction stack. A spacer material, at step 924, is deposited over and in contact with the seed layer, the magnetic tunnel junction stack, and the hardmask. The spacer material, at step 926, is etched to form a spacer on sidewalls of the magnetic tunnel junction stack and hardmask. The control flow exits at step 928.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for fabricating a semiconductor device, the method comprising:
   forming a trench within a substrate;
   forming a liner in contact with a bottom surface and sidewalls of the trench;
   forming a trench line within the trench and in contact with the liner;
   forming a pad layer above the trench line and in contact with a respective top surface of each of the substrate, the liner, and the trench line;
   forming a seed layer on and in contact with the pad layer;
   annealing the seed layer, wherein the annealing alters a grain structure of the seed layer and roughens a top surface of the seed layer;
   planarizing the seed layer after the seed layer has been annealed, wherein the planarizing smooths the top surface of the seed layer; and
   forming a magnetic tunnel junction stack on and in contact with the seed layer after the seed layer has been planarized.

2. The method of claim 1, wherein the annealing is performed at a temperature ranging from 200° C. to 400° C.

3. The method of claim 1, wherein the seed layer is planarized to have a Root Mean Square surface roughness ranging from 1 Angstrom to 3 Angstroms.

4. The method of claim 1, wherein forming the magnetic tunnel junction stack comprises:
   depositing magnetic tunnel junction stack layers on and in contact with the seed layer; and
   etching the magnetic tunnel junction stack layers to form the magnetic tunnel junction stack.

5. The method of claim 4, wherein etching the magnetic tunnel junction stack layers to form the magnetic tunnel junction stack comprises:
   forming a hardmask on the magnetic tunnel junction stack layers; and
   etching portions of the magnetic tunnel junction stack layers not underlying the hardmask.

* * * * *